United States Patent
Azadzoi et al.

(10) Patent No.: US 10,813,210 B2
(45) Date of Patent: Oct. 20, 2020

(54) RADIO FREQUENCY CIRCUIT COMPRISING AT LEAST ONE SUBSTRATE WITH A CONDUCTIVELY FILLED TRENCH THEREIN FOR ELECTRICALLY ISOLATING A FIRST CIRCUIT PORTION FROM A SECOND CIRCUIT PORTION

(71) Applicant: RAYTHEON COMPANY, Waltham, MA (US)

(72) Inventors: Semira M. Azadzoi, Tewksbury, MA (US); James E. Benedict, Lowell, MA (US); John P. Haven, Lowell, MA (US); Thomas V. Sikina, Acton, MA (US); Andrew R. Southworth, Lowell, MA (US)

(73) Assignee: RAYTHEON COMPANY, Waltham, MA (US)

( * ) Notice: Subject to any disclaimer, the term of this patent is extended or adjusted under 35 U.S.C. 154(b) by 69 days.

(21) Appl. No.: 16/184,571

(22) Filed: Nov. 8, 2018

(65) Prior Publication Data
US 2019/0150271 A1 May 16, 2019

Related U.S. Application Data

(60) Provisional application No. 62/673,491, filed on May 18, 2018, provisional application No. 62/636,364,
(Continued)

(51) Int. Cl.
*H05K 1/02* (2006.01)
*H01P 3/08* (2006.01)
(Continued)

(52) U.S. Cl.
CPC ............. *H05K 1/0219* (2013.01); *H01P 3/08* (2013.01); *H01P 3/082* (2013.01); *H01P 11/003* (2013.01);
(Continued)

(58) Field of Classification Search
CPC .......... H01P 3/003; H01P 3/006; H01P 3/082; H01P 11/003; H01P 3/06; H01P 11/005; H05K 1/0219
(Continued)

(56) References Cited

U.S. PATENT DOCUMENTS

| 4,875,087 A | 10/1989 | Miyauchi et al. |
| 5,401,175 A | 3/1995 | Guimond et al. |

(Continued)

FOREIGN PATENT DOCUMENTS

| CN | 201845850 U | 5/2011 |
| CN | 106936521 A | 7/2017 |

(Continued)

OTHER PUBLICATIONS

International Search Report and Written Opinion in application No. PCT/US2018/059636 dated Mar. 4, 2019.

(Continued)

*Primary Examiner* — Benny T Lee
(74) *Attorney, Agent, or Firm* — Lando & Anastasi, LLP

(57) ABSTRACT

A radio frequency circuit includes at least one dielectric substrate, a trench formed in the dielectric substrate, and an electrically continuous conductive material in the trench. The radio frequency circuit further may include a first dielectric substrate, a second dielectric substrate, with the trench being formed in the first and second dielectric substrates. A method of fabricating an electromagnetic circuit includes providing at least one dielectric substrate, machining a trench in the at least one dielectric substrate, and filling the trench with an electrically conductive material to form an electrically continuous conductor.

17 Claims, 8 Drawing Sheets

Related U.S. Application Data filed on Feb. 28, 2018, provisional application No. 62/636,375, filed on Feb. 28, 2018, provisional application No. 62/584,260, filed on Nov. 10, 2017, provisional application No. 62/584,264, filed on Nov. 10, 2017.

(51) Int. Cl.

| | | |
|---|---|---|
| *H01P 11/00* | (2006.01) | |
| *H05K 1/11* | (2006.01) | |
| *H05K 3/00* | (2006.01) | |
| *H05K 3/10* | (2006.01) | |
| *H05K 3/40* | (2006.01) | |
| *H05K 3/46* | (2006.01) | |

(52) U.S. Cl.
CPC ......... *H05K 1/0218* (2013.01); *H05K 1/0221* (2013.01); *H05K 1/0251* (2013.01); *H05K 1/112* (2013.01); *H05K 3/0044* (2013.01); *H05K 3/107* (2013.01); *H05K 3/4007* (2013.01); *H05K 3/4038* (2013.01); *H05K 3/4611* (2013.01); *H05K 2201/0707* (2013.01); *H05K 2201/09036* (2013.01); *H05K 2201/09545* (2013.01); *H05K 2203/0228* (2013.01)

(58) Field of Classification Search
USPC ......................................................... 333/238
See application file for complete search history.

(56) References Cited

U.S. PATENT DOCUMENTS

| | | | |
|---|---|---|---|
| 5,426,399 A * | 6/1995 | Matsubayashi et al. | ..................... H01B 7/0861 174/117 FF |
| 5,828,555 A | 10/1998 | Itoh | |
| 5,857,858 A | 1/1999 | Gorowitz et al. | |
| 6,000,120 A | 12/1999 | Arledge et al. | |
| 6,137,453 A | 10/2000 | Wang et al. | |
| 6,353,189 B1 | 3/2002 | Shimada et al. | |
| 6,400,234 B1 | 6/2002 | Ohhashi et al. | |
| 6,486,755 B2 | 11/2002 | Aruga | |
| 6,651,322 B1 | 11/2003 | Currie | |
| 6,674,347 B1 | 1/2004 | Maruhashi et al. | |
| 6,747,217 B1 | 6/2004 | Jochym et al. | |
| 7,038,622 B2 | 5/2006 | Schmidt et al. | |
| 7,405,477 B1 | 7/2008 | Tao et al. | |
| 7,443,279 B2 | 10/2008 | Yagisawa et al. | |
| 8,749,434 B2 | 6/2014 | Han et al. | |
| 2003/0067410 A1 | 4/2003 | Puzella et al. | |
| 2003/0188889 A1 | 10/2003 | Straub et al. | |
| 2003/0201851 A1* | 10/2003 | Yoshida et al. | ......... H01P 3/003 333/246 |
| 2006/0214744 A1 | 9/2006 | Margomenos | |
| 2009/0000804 A1 | 1/2009 | Kobayashi et al. | |
| 2010/0182105 A1 | 7/2010 | Hein et al. | |
| 2010/0206617 A1 | 8/2010 | Johnson et al. | |
| 2010/0254094 A1 | 10/2010 | Ohhira | |
| 2013/0009729 A1* | 1/2013 | Kim | ........................ H01P 3/081 333/238 |
| 2013/0154773 A1 | 6/2013 | Siprak | |
| 2015/0189754 A1 | 7/2015 | Bohra et al. | |
| 2015/0323576 A1 | 11/2015 | Bulja et al. | |
| 2016/0079646 A1 | 3/2016 | Ichige | |
| 2016/0172741 A1 | 6/2016 | Panat et al. | |
| 2017/0117620 A1 | 4/2017 | Lapushin | |

FOREIGN PATENT DOCUMENTS

| | | |
|---|---|---|
| CN | 206742473 U | 12/2017 |
| EP | 1202377 A2 | 5/2002 |
| EP | 1473979 A1 | 11/2004 |
| GB | 2322237 A | 8/1998 |

OTHER PUBLICATIONS

Farhan Shafique et al. "Laser machining of microvias and trenches for substrate integrated waveguides in LTCC technology", Proceedings of the 39th European Microwave Conference (2009), pp. 272-275.
Deslandes et al. "Integrated Microstrip and Rectangular Waveguide in Planar Form", IEEE Microwave and Wireless Components Letters (2001) vol. 11, No. 2, pp. 68-70.
International Search Report and Written Opinion in application No. PCT/US2018/059625 dated Mar. 4, 2019.
Leib et al. "An ultra-wideband vertical transition from microstrip to stripline in PCB technology", Proceedings of 2010 IEEE International Conference on Ultra-Wideband (2010), p. 1-4.
International Search Report and Written Opinion in application No. PCT/US2018/059240 dated Mar. 4, 2019.
Mukherjee et al. "Broadband Substrate Integrated Waveguide Cavity-Backed Bow-Tie Slot Antenna", IEEE Antennas and Wireless Propagation Letters (2014) vol. 13, p. 1152-1155.
Liu et al. "Broadband Circularly Polarized Antenna With High Gain for Ku-band Applications", IEEE Conference Proceedings (2017), p. 1-2.
Kim et al. "Slot-Coupled Circularly Polarized Array Antenna With Substrate-Integrated Waveguide Cavity for Parallel-Plate-Mode Suppression", IEEE Transactions on Antennas and Propagation (2017) vol. 65, No. 8, p. 3999-4006.
Luo et al. "Antenna Array Elements for Ka-band Satellite Communication on the Move", Loughborough Antennas & Propagation Conference (2013), p. 135-139.
Beeresha et al. "Embedded Microstrip Line to Stripline Vertical Transition Using LTCC Technique", International Journal of Research in Engineering and Technology (2015) vol. 4, Issue 12, pp. 30-34.
Shan et al. "A Compact Broadband Stripline-fed Slot Antenna for Array Application", IEEE International Workshop on Antenna Technology (2005), pp. 555-558.
International Search Report and Written Opinion in application No. PCT/US2018/059602 dated Apr. 18, 2019.
Hong et al. "Grid Assembly-Free 60-GHz Antenna Module Embedded in FR-4 Transceiver Carrier Board", IEEE Transactions on Antennas and Propagation (2013) vol. 61, No. 4, pp. 1573-1580.
Invitation to Pay Additional Fees in application No. PCT/US2018/059410 dated Apr. 23, 2019.
International Search Report and Written Opinion in application No. PCT/US2018/059841 dated Mar. 9, 2019.
Sitaraman et al. "Modeling, Design and Demonstration of Integrated Electromagnetic Shielding for Miniaturized RF SOP Glass Packages", Electronic Components & Technology Conference (2015), p. 1956-1960.
Bailey, M. "General Layout Guidelines for RF and Mixed-Signal PCBs", Maxim Integrated (2011), pp. 1-10. Retrieved from URL: <<https://pdfserv.maximintegrated.com/en/an/AN5100.pdf>>.
International Search Report in application No. PCT/US2019/019851 dated May 29, 2019.
Jung et al. "Inkjet-printed resistors with a wide resistance range for printed read-only memory applications", Organic Electronics (2013) vol. 14, pp. 699-702.
Kim et al. "Fabrication of Fully Inkjet-Printed Vias and SIW Structures on Thick Polymer Substrates", IEEE Transactions on Components, Packaging and Manufacturing Technology (2016) vol. 6, No. 3, pp. 486-496.
International Search Report and Written Opinion in application No. PCT/US2019/019847 dated May 29, 2019.
Kangasvieri et al. "An Ultra-Wideband BGA-Via Transition for High-Speed Digital and Millimeter-Wave Packaging Applications", IEEE (2007), pp. 1637-1640.

\* cited by examiner

RADIO FREQUENCY CIRCUIT COMPRISING AT LEAST ONE SUBSTRATE WITH A CONDUCTIVELY FILLED TRENCH THEREIN FOR ELECTRICALLY ISOLATING A FIRST CIRCUIT PORTION FROM A SECOND CIRCUIT PORTION

CROSS-REFERENCE TO RELATED APPLICATION

This application claims the benefit under 35 U.S.C. § 119(e) of U.S. Provisional Patent Application No. 62/673,491 titled ADDITIVE MANUFACTURING TECHNOLOGY (AMT) FARADAY BOUNDARIES IN RADIO FREQUENCY CIRCUITS filed on May 18, 2018, U.S. Provisional Patent Application No. 62/584,260 titled SPIRAL ANTENNA AND RELATED FABRICATION TECHNIQUES filed on Nov. 10, 2017, U.S. Provisional Patent Application No. 62/584,264 titled ADDITIVE MANUFACTURING TECHNOLOGY (AMT) LOW PROFILE RADIATOR filed on Nov. 10, 2017, U.S. Provisional Patent Application No. 62/636,364 titled SNAP-RF INTERCONNECTIONS filed on Feb. 28, 2018, and U.S. Provisional Patent Application No. 62/636,375 titled ADDITIVE MANUFACTURING TECHNOLOGY (AMT) LOW PROFILE SIGNAL DIVIDER filed on Feb. 28, 2018, each of which is herein incorporated by reference in its entirety for all purposes.

BACKGROUND

Radio frequency (RF) and electromagnetic circuits may be manufactured using conventional printed circuit board (PCB) processes. Conventional PCB manufacturing processes may include lamination, electroplating, masking, etching, and other complex process steps, and may require multiple steps, expensive and/or hazardous materials, multiple iterations, extensive labor, etc., all leading to higher cost and slower turnaround time. Additionally, conventional PCB manufacturing processes have limited ability to allow for small feature sizes, such as signal trace (e.g., stripline) dimensions, and dimensions of dielectric materials between conductors (e.g., dielectric thickness, inter-via spacing, etc.), thereby limiting the range of highest frequency signals that may be supported by such circuits.

SUMMARY OF THE INVENTION

Aspects and embodiments described herein provide simplified circuit structures, and manufacturing methods thereof, for conveyance of electrical signals, especially radio frequency signals, within a circuit, and more particularly provide enhanced isolation of signals, between components and along signal lines, into the microwave and millimeter wave ranges, by providing a continuous electromagnetic boundary (e.g., electrical conductor) within a circuit. Circuits, structures, and fabrication methods described herein use subtractive and additive manufacturing technology to provide vertical (e.g., extending between layers) trenches filled with conductive material, as electromagnetic boundaries to provide electromagnetic isolation within a circuit, achieving a substantially continuous boundary to provide enhanced isolation for higher frequency operation than conventional techniques (such as ground vias).

Various signal conductors, Faraday boundaries, and other circuit structures may be fabricated more simply and with smaller feature sizes than conventional techniques. Such circuit structures are suitable for operation into the microwave and millimeter wave ranges.

Still other aspects, examples, and advantages are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment. Various aspects and embodiments described herein may include means for performing any of the described methods or functions.

One aspect of the present disclosure is directed to a radio frequency circuit comprising at least one dielectric substrate, a trench formed in the dielectric substrate, and an electrically continuous conductive material in the trench.

Embodiments of the radio frequency circuit further may include a first dielectric substrate and a second dielectric substrate, with the trench being formed in the first and second dielectric substrates. The radio frequency circuit further may include a first ground plane disposed upon a bottom surface of the second substrate and a second ground plane disposed upon a top surface of the second substrate, with a portion of the second ground plane forming a signal trace including a terminal pad. The radio frequency circuit further may include a vertical conductor secured to the terminal pad of the signal trace. The electrically continuous conductive material at least partially may surround the vertical conductor. The electrically continuous conductive material may be configured to at least partially contain an electromagnetic field within a confined region of the radio frequency circuit. The electrically continuous conductive material may be configured to at least partially isolate a first circuit portion disposed within a layer of the at least one dielectric substrate from a second circuit portion disposed within the layer of the at least one dielectric substrate. At least one of the first circuit portion and the second circuit portion may be configured to operate in at least one of a microwave range of frequencies or a millimeter wave range of frequencies. The first circuit portion may be configured to operate in a first range of frequencies and the second circuit portion may be configured to operate in a second range of frequencies that overlaps with the first range of frequencies. The first circuit portion may be configured to operate in a first range of frequencies and the second circuit portion is configured to operate in a second range of frequencies, with at least one frequency in the second range of frequencies being within an octave of at least one frequency in the first range of frequencies.

Another aspect of the present disclosure is directed to a method of fabricating an electromagnetic circuit. In one embodiment, the method comprises: providing at least one dielectric substrate; machining a trench in the at least one dielectric substrate; and filling the trench with an electrically conductive material to form an electrically continuous conductor.

Embodiments of the method further may include forming a first ground plane on a bottom surface of the second substrate and forming a second ground plane on a top surface of the second substrate, with a portion of the second ground plane forming a signal trace including a terminal pad. The method further may include securing a vertical conductor to the terminal pad of the signal trace. The electrically continuous conductive material at least partially may surround the vertical conductor. Providing at least one dielectric substrate may include providing a first dielectric substrate and a second dielectric substrate, the trench being formed in the first and second dielectric substrates.

Yet another aspect of the present disclosure is directed to a method of fabricating an electromagnetic circuit. In one embodiment, the method comprises: milling a conductive material disposed upon a first substrate to form a signal trace, the signal trace including a terminal pad; bonding a second substrate to the first substrate to substantially encapsulate the signal trace and terminal pad between the first substrate and the second substrate; drilling through the second substrate to provide an access hole to the terminal pad; milling through the first and second substrate to form a trench, the trench positioned at least partially around the terminal pad; depositing a conductor into the access hole, the conductor making electrical connection to the terminal pad; and depositing a conductive ink into the trench to form an electrically continuous conductor within the first and second substrate.

Embodiments of the method further may include the electrically continuous conductor being configured to at least partially isolate a first circuit portion disposed within the first substrate from a second circuit portion disposed within the second substrate. At least one of the first circuit portion and the second circuit portion may be configured to operate in at least one of a microwave range of frequencies or a millimeter wave range of frequencies. The first circuit portion may be configured to operate in a first range of frequencies and the second circuit portion may be configured to operate in a second range of frequencies that overlaps with the first range of frequencies. The first circuit portion may be configured to operate in a first range of frequencies and the second circuit portion may be configured to operate in a second range of frequencies, with at least one frequency in the second range of frequencies being within an octave of at least one frequency in the first range of frequencies.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the disclosure. In the figures, each identical or nearly identical component that is illustrated in various figures may be represented by a like numeral. For purposes of clarity, not every component may be labeled in every figure. In the figures.

DETAILED DESCRIPTION OF THE INVENTION

Figure 1:
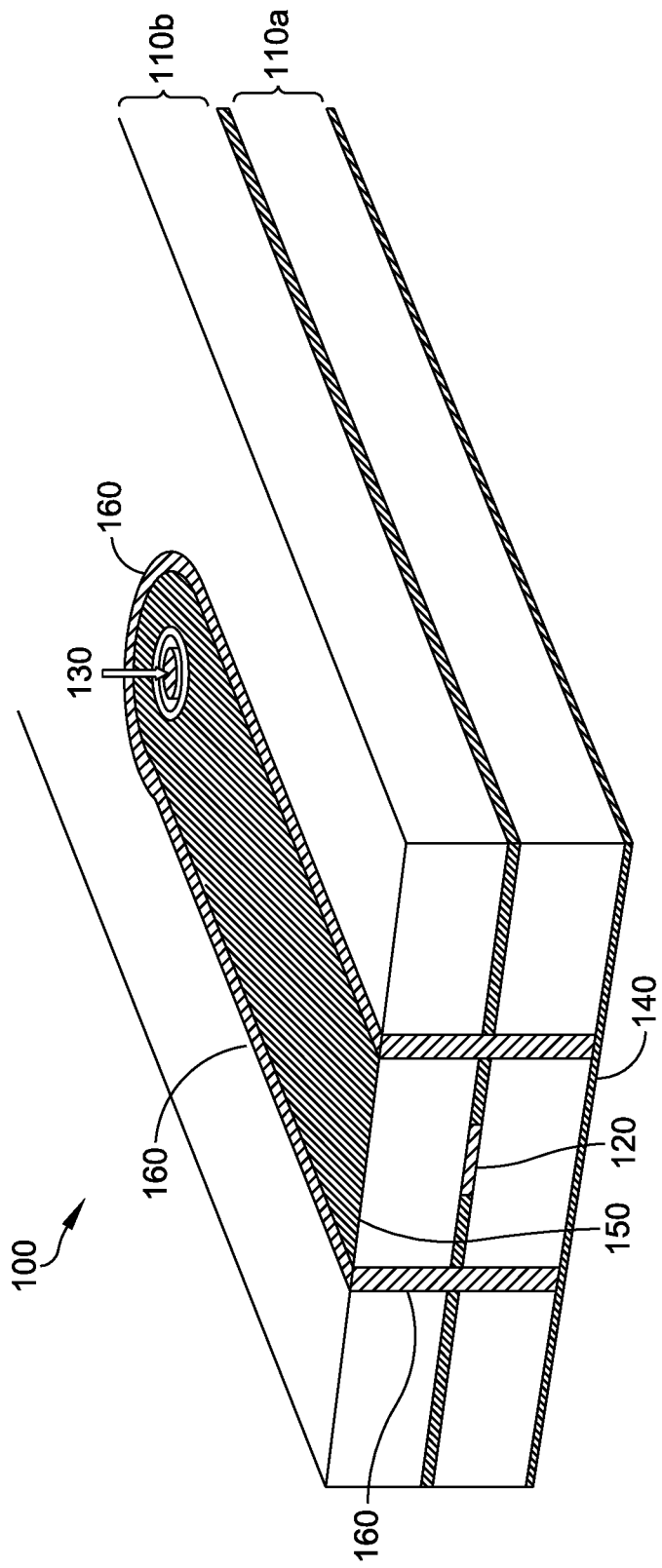
FIG. 1 is a schematic diagram of an example of an electromagnetic circuit portion that includes a Faraday wall.

Aspects and examples described herein provide signal conductors (e.g., signal traces, strip lines, inter-layer "vertical" feeds) and reference surfaces and conductors (e.g., ground planes, Faraday boundaries or "walls") within various circuits, suitable for various circuit board manufacturing, including radio frequency circuit embodiments. The aspects and examples described herein advantageously apply additive and subtractive manufacturing techniques to provide structures for conveyance and containment of various signals, and particularly of radio frequency signals in microwave and millimeter wave ranges, e.g., up to 300 GHz or more.

In some embodiments, a signal trace (e.g., conductor) may be formed on a dielectric substrate by machining away (e.g., milling) a portion of cladding (e.g., electroplate copper) from a surface of the substrate.

In some embodiments, a wire conductor may convey a signal "vertically" between layers (e.g., to/from a signal trace line) within a circuit board, and may be used to feed a signal to or from various other layers or circuit components, such as a waveguide, a radiator (e.g., an antenna), a connector, or other circuit structures. Such a "vertical" inter-layer signal feed may be formed by machining a hole in one or more dielectric substrates, applying solder to one or more conductor surfaces, inserting a segment of wire (e.g., copper wire) into the hole, and reflowing the solder to mechanically and electrically secure a connection.

In some embodiments, a continuous conducting structure may be formed in one or more dielectric substrates by machining a trench and filling the trench with a conductor, such as a conductive ink applied using 3-D printing techniques, to form an electromagnetic boundary. Such an electromagnetic boundary may enforce boundary conditions of an electromagnetic signal, e.g., to control or limit modes of a signal and/or characteristic impedance, or may provide isolation to confine signals to a region of an electromagnetic circuit, e.g., a Faraday boundary to prevent a signal at one region of the circuit from affecting another region of the circuit, e.g., shielding.

Manufacturing processes described herein may be particularly suitable for fabrication of such circuit structures having small circuit features capable of supporting electromagnetic signals in the range of 8 to 75 GHz or more, for example, and up to 300 GHz or more, using suitable subtractive (e.g., machining, milling, drilling, cutting, stamping) and additive (e.g., filling, flowing, 3-D printing) manufacturing equipment. Electromagnetic circuit structures in accordance with systems and methods described herein may be particularly suitable for application in 28 to 70 GHz systems, including millimeter wave communications, sensing, ranging, etc. Aspects and embodiments described may also be suitable for lower frequency ranges, such as in the S-band (2-4 GHz), X-band (8-12 GHz), or others.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, end, side, vertical and horizontal, and the like, are intended for convenience of description, not to limit the present systems and methods or their components to any one positional or spatial orientation.

The term "radio frequency" as used herein is not intended to be limited to a particular frequency, range of frequencies, band, spectrum, etc., unless explicitly stated and/or specifically indicated by context. Similarly, the terms "radio frequency signal" and "electromagnetic signal" are used interchangeably and may refer to a signal of various suitable frequency for the propagation of information-carrying signals for any particular implementation. Such radio frequency signals may generally be bound at the low end by frequencies in the kilohertz (kHz) range, and bound at the high end by frequencies of up to hundreds of gigahertz (GHz), and explicitly includes signals in the microwave or millimeter wave ranges. Generally, systems and methods in accordance with those described herein may be suitable for handling non-ionizing radiation at frequencies below those conventionally handled in the field of optics, e.g., of lower frequency than, e.g., infrared signals.

Various embodiments of radio frequency circuits may be designed with dimensions selected and/or nominally manufactured to operate at various frequencies. The selection of appropriate dimensions may be had from general electromagnetic principles and are not presented in detail herein.

The methods and apparatuses described herein may support smaller arrangements and dimensions than conventional processes are capable. Such conventional circuit boards may be limited to frequencies below about 30 GHz. The methods and apparatuses described herein may allow or accommodate the manufacture of electromagnetic circuits of smaller dimensions, suitable for radio frequency circuits intended to be operated at higher frequencies, using safer and less complex manufacturing, and at lower cost.

Electromagnetic circuits and methods of manufacture in accordance with those described herein include various additive and subtractive manufacturing techniques to produce electromagnetic circuits and components capable of handling higher frequencies, with lower profiles, and at reduced costs, cycle times, and design risks, than conventional circuits and methods. Examples of techniques include machining (e.g., milling) of conductive material from a surface of a substrate to form signal traces (e.g., signal conductors, striplines) or apertures, which may be of significantly smaller dimensions than allowed by conventional PCB processes, machining of one or more substrates to form a trench, using 3-dimensional printing techniques to deposit printed conductive inks into the trench to form a continuous electric barrier (e.g., a Faraday wall) (as opposed to a series of ground vias with minimum spacing therebetween), "vertical launch" signal paths formed by machining (such as milling, drilling, or punching) a hole through a portion of substrate and in which a wire is placed (and/or conductive ink is printed), to make electrical contact to a signal trace disposed on a surface of the substrate (or an opposing substrate), and using 3-dimensional printing techniques to deposit printed resistive inks to form resistive components.

Any of the above example techniques and/or others (e.g., soldering and/or solder reflow), may be combined to make various electromagnetic components and/or circuits. Aspects and examples of such techniques are described and illustrated herein with respect to a radio frequency interconnect to contain and convey an electromagnetic signal along a layer of an electromagnetic circuit in one dimension and vertically through to other layers of the circuit in another dimension. The techniques described herein may be used to form various electromagnetic components, connectors, circuits, assemblies, and systems.

FIG. 1 illustrates an example of an electromagnetic circuit structure 100 that may be a portion of a larger electromagnetic circuit. The circuit structure 100 includes a pair of dielectric substrates 110a, 110b bonded together and having a signal trace 120 enclosed between them. The signal trace 120 is an electrical conductor configured to convey electromagnetic signals within the circuit, e.g., within the circuit structure 100, and may be formed by machining away a cladding, such as electroplated copper, from a surface of either of the substrates 110a, 110b. The signal trace 120 also has an electrical connection formed on a terminal pad, such as by solder, to a "vertical" conductor 130, which may be, e.g., a wire disposed within a machined hole in the substrate 110b. Accordingly, the conductor 130 and the signal trace 120 form an electrically continuous signal conveyance, and each may convey and provide signals beyond the extent of the portion shown in FIG. 1.

In some embodiments, a ground plane 140 may be provided and may be formed of a conductive cladding disposed upon a "bottom" surface of the substrate 110a. An additional ground plane 150 may be provided upon a "top" surface of the substrate 110b. For example, the ground plane 150 may be formed by a conductive cladding disposed upon the substrate 110b. A portion of the conductive cladding may be removed by machining (e.g., milling) to provide a ground plane with an appropriate physical dimension, shape, or extent, e.g., to be suitable to act as the ground plane 150 for the signal trace 120.

The circuit structure 100 also includes a Faraday wall 160, sometimes referred to as an "electrically continuous conductive material," that is a conductor providing an electromagnetic boundary "vertically" through the substrates 110a, 110b. The Faraday wall 160 may be formed by machining a trench through the substrates 110a, 110b down to the ground plane 140 and filling the trench with a conductive material, such as a conductive ink applied with additive manufacturing techniques, e.g., 3-D printing. The conductive ink, when set, may form a substantially electrically continuous conductor. As shown, the trench in which the Faraday wall 160 is formed does not pierce or go through the ground plane 140. The Faraday wall 160 may therefore be in electrical contact with the ground plane 140. Additionally, a "top" of the Faraday wall 160 may be in electrical contact with the ground plane 150, which may be accomplished by slight over-filling of the machined trench to ensure contact between the conductive ink and the ground plane 150 and/or by application of solder, for example.

As illustrated in FIG. 1, the ground plane 140, ground plane 150, and Faraday wall 160 together form a substantially electrically continuous conductor that provides a boundary for signal(s) conveyed by the signal trace 120. In some embodiments, dimensional placement of the ground planes 140, 150 and the Faraday wall 160 may be selected to control or limit a propagating mode of a signal conveyed by the signal trace 120 and/or to establish a characteristic impedance for signal(s) conveyed by the signal trace 120. In certain embodiments, the ground planes 140, 150 and the Faraday wall 160 may be positioned such that only a transverse electromagnetic (TEM) signal mode may propagate along the signal trace 120. In other embodiments, the Faraday wall 160 may be positioned to isolate one portion of a circuit from another portion of a circuit without enforcing a particular propagating mode and/or without contributing to an impedance for any particular signal(s).

As stated above, the structure 100 is merely an example and portion of a structure in which an electromagnetic circuit may be provided. Further extent of the substrates shown may accommodate various circuit components, and additional substrates having additional layers to accommodate additional circuit components may be provided in various embodiments. Typically, a portion of a circuit may be disposed on a particular layer, and may include ground planes above and/or below, and other portions of a total circuit (or system) may exist at different regions of the same layer or on other layers.

Figure 2:
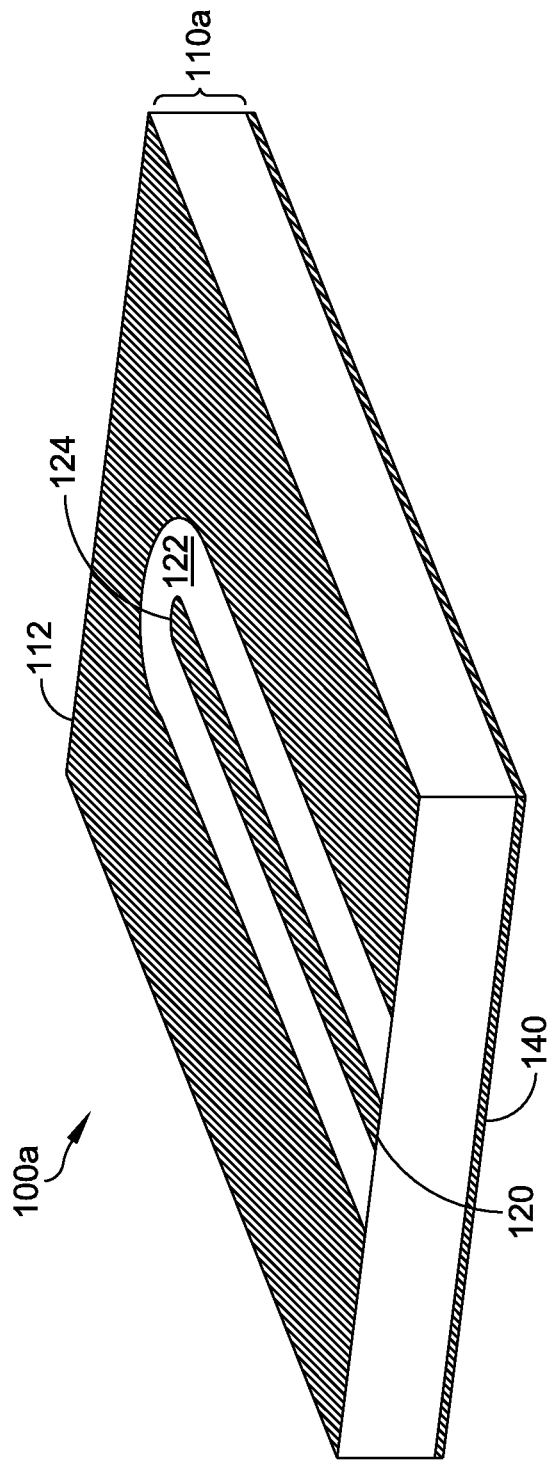
FIG. 2 is a schematic diagram of a stage of manufacture of the electromagnetic circuit portion of FIG. 1.

FIG. 2 shows a portion structure 100a of the circuit structure 100 as illustrated in FIG. 1 at one stage of manufacture, in accordance with aspects and embodiments of the systems and methods described herein. The portion structure 100a includes the substrate 110a which may be provided with conductive (e.g., copper) cladding on various surfaces. In this example, the substrate 110a has a conductive cladding 112 on one surface that serves as the conductive material from which the signal trace 120 is formed. Also in this example, the substrate 110a has a conductive cladding on an opposing surface to serve as the ground plane 140. The signal trace 120 may be formed by machining away at least a portion 122 of the cladding 112, thereby leaving a portion of conductive material to serve as the signal trace 120, distinct from the remainder of the cladding 112. Various examples may provide other types of circuit components disposed adjacent to a surface of the substrate 110a, and for which a conductor may be provided to convey signals and for which a Faraday boundary may be provided to isolate signals to or from the circuit component. As shown, the signal trace includes a terminal pad 124.

Figure 3:
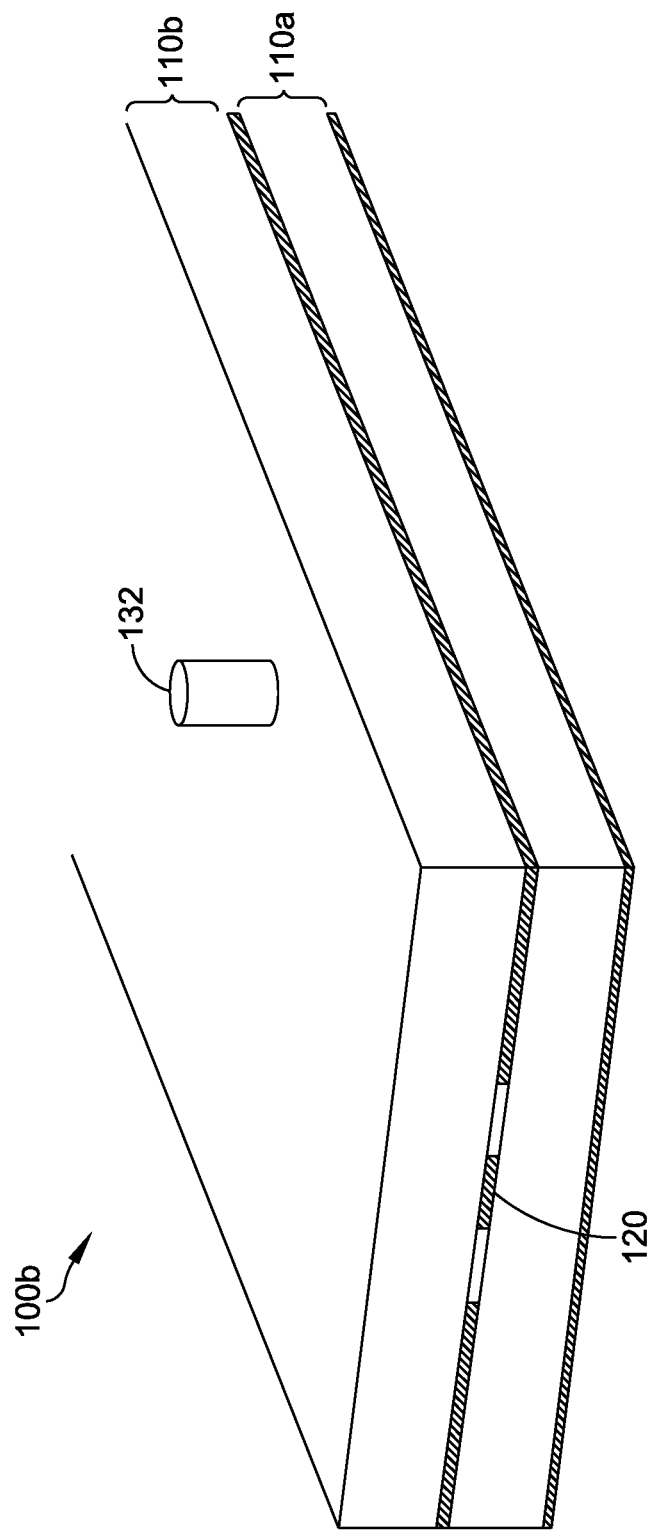
FIG. 3 is a schematic diagram of another stage of manufacture of the electromagnetic circuit portion of FIG. 1.

FIG. 3 shows another portion structure 100b of the circuit structure 100 as illustrated in FIG. 1 at another stage of manufacture. For the portion structure 100b, the substrate 110b is aligned with the substrate 110a, to be bonded together. In some examples, a temporary bonding or affixing may be applied and a permanent bonding step may be applied at a later time, such as a bonding that may require heat or baking to cure or to secure a permanency of the bonding. A hole 132 may be machined through the substrate 110b, the hole 132 positioned to align with a portion of the signal trace 120. For example, the hole 132 may be aligned with a terminal end of the signal trace 120. Various examples may have a hole aligned with other portions of a signal trace and/or with portions of other types of circuit components. In various embodiments, a "top" surface of the substrate 110b may include a conductive cladding, which may be used to provide a ground plane, if desired, and portions may be machined away to form various other structures, components, or a ground plane having a desired shape or extent.

With reference to FIG. 2, the conductive cladding 112 from which the signal trace 120 is formed (e.g., by machining away the portion 122) may equivalently be associated with the substrate 110b, e.g., on a "bottom" side with respect to FIG. 3, instead of being associated with the substrate 110a. In other words, the conductive material from which the signal trace 120 is provided may be a conductive cladding associated with either of the substrates 110a, 110b. Further, the signal trace 120 or other circuit components (e.g., to exist between the substrates 110a, 110b) may be provided from differing materials and/or through other means in various embodiments.

Figure 4:
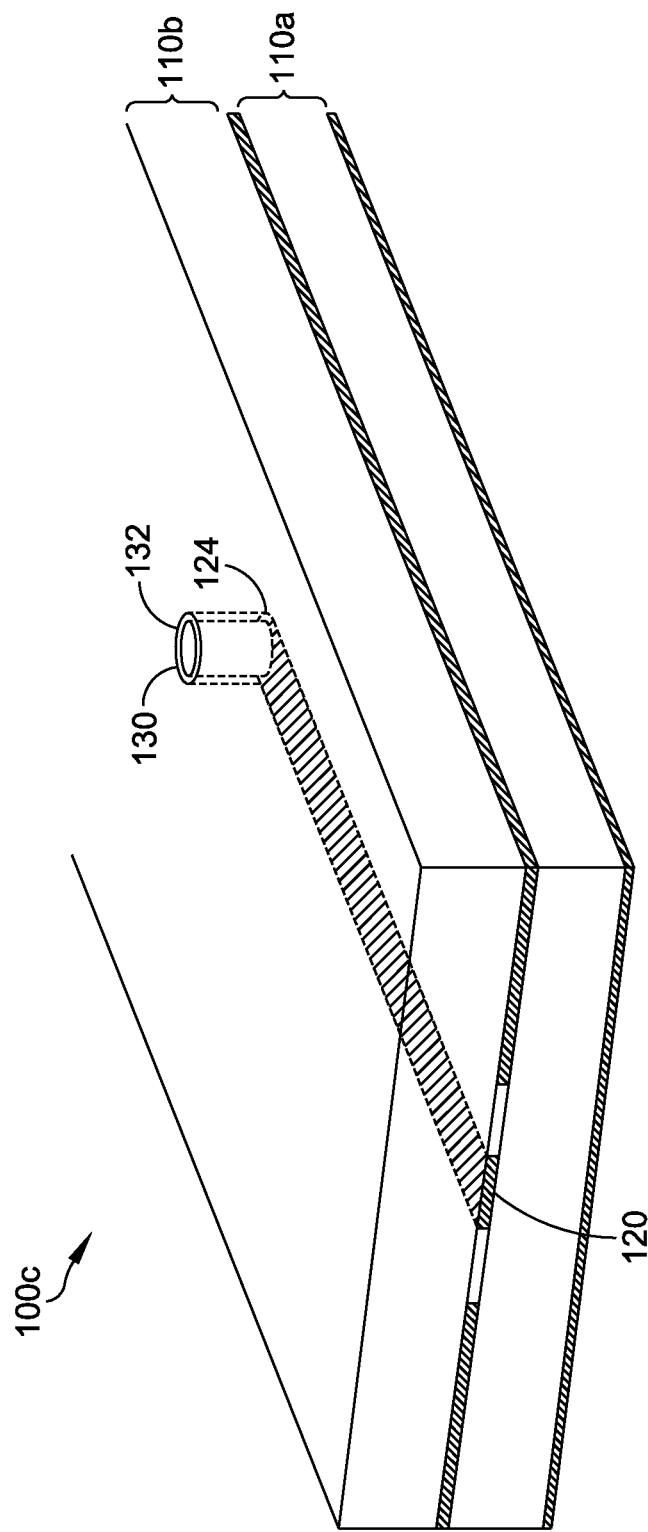
FIG. 4 is a schematic diagram of another stage of manufacture of the electromagnetic circuit portion of FIG. 1.

FIG. 4 shows another portion structure 100c of the circuit structure 100 as shown in FIG. 1 at another stage of manufacture. For the portion structure 100c, the conductor 130 is shown in the hole 132. Solder tinning may be provided on the conductor 130 and/or on the terminal end, e.g., the terminal pad 124, of the signal trace 120 (e.g., adjacent one end of the conductor 130), and the solder may be reflowed to secure a physical and electrical connection between the signal trace 120 and the conductor 130. For example, application of heat to the exposed end of the conductor 130 may travel through the conductor 130 and at least partially melt the solder to secure the connection. Solder reflow may be performed at various points in a manufacturing process. For example, a later solder application to secure a further component to an exposed end of the conductor may provide the heat to accomplish the reflow of solder at the junction between the signal trace 120 and the conductor 130.

Figure 5:
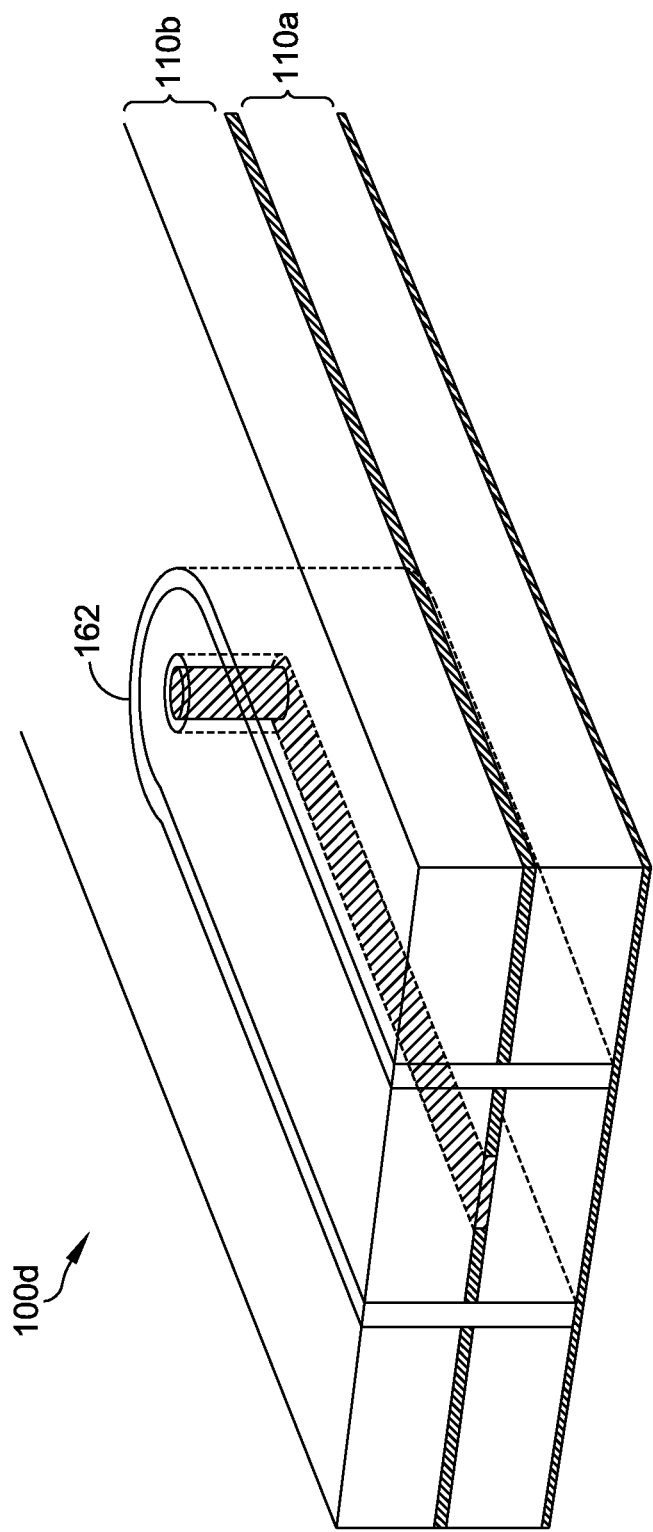
FIG. 5 is a schematic diagram of another stage of manufacture of the electromagnetic circuit portion of FIG. 1.

FIG. 5 shows another portion structure 100d of the circuit structure 100 as shown in FIG. 1 at another stage of manufacture. For the portion structure 100d, a trench 162 is milled through the substrates 110a, 110b. In this example, the trench 162 is milled through the substrates 110a, 110b to the conductive cladding that forms the ground plane 140 shown in FIG. 1, without piercing the ground plane 140. In some embodiments, the intact ground plane 140 shown in FIG. 1 may provide some structural support to portions of the structure 100d while the trench is empty.

Figure 6:
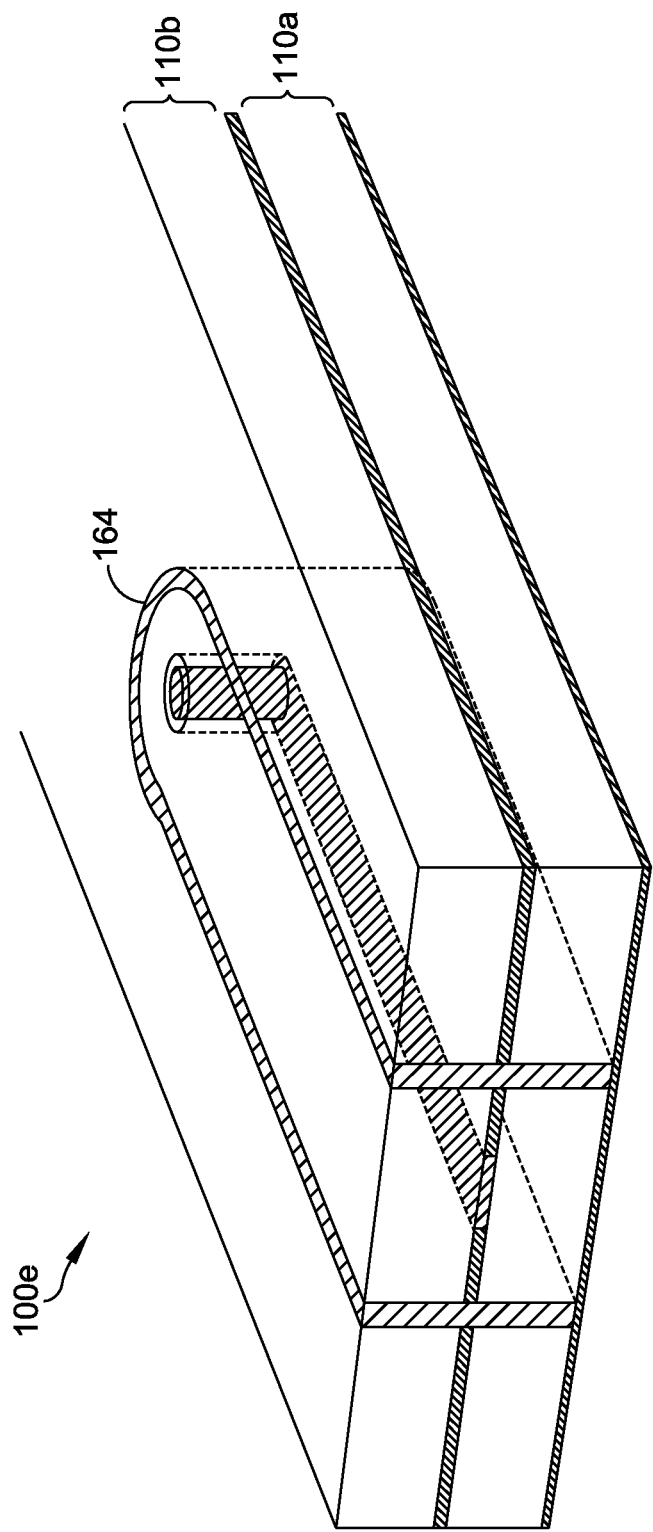
FIG. 6 is a schematic diagram of another stage of manufacture of the electromagnetic circuit portion of FIG. 1.

FIG. 6 shows another portion structure 100e of the circuit structure 100 as shown in FIG. 1 at another stage of manufacture. In the portion structure 100e, the trench 162 as shown in FIG. 5 is filled with a conductive fill 164 to form the Faraday wall 160 as shown in FIG. 1. The conductive fill 164 may make electrical contact with the ground plane 140 as shown in FIG. 1 to form a substantially electrically continuous ground boundary. As described above with respect to FIG. 1, a further ground plane 150 as shown in FIG. 1 may be included, and to which the conductive fill 164 may be electrically connected by physical contact and/or by further application of solder at positions along the Faraday wall 160 to electrically join with the ground plane 150 as shown in FIG. 1. In some embodiments, the intact ground plane 140 shown in FIG. 1 and the cured (e.g., cooled, solidified) conductive fill 164 may provide structural support to the structure 100e, e.g., in place of the material(s) that was machined away to form the trench 162 shown in FIG. 5.

As described above, positioning of the Faraday wall 160 as shown in FIG. 1 may be selected for its influence on signal(s) conveyed by the signal trace 120. In various embodiments, a Faraday wall may be positioned to provide isolation without regard to influencing a signal in any particular way other than to provide the isolation. For example, and with reference to FIG. 7, there is shown a circuit structure 700 that includes various Faraday walls 760 positioned to reduce or eliminate signal leakage (e.g., radio frequency energy) between various portions of the circuit structure 700. Stated another way, the Faraday walls 760, sometimes referred to as "electrically continuous conductive material," is configured to at least partially contain an electromagnetic field within a confined region of the circuit structure 700. In this example, the circuit structure 700 implements a 4:1 signal combiner/divider having five access conductors 730, each of which provides electrical access to various signal traces 720 that interconnect three Wilkinson dividers 724. For example, the signal traces 720 and the Wilkinson dividers 724 may be disposed on an intermediate layer of a circuit board. The Faraday walls 760 may extend into the plane of the figure to a ground plane "below" and up to a "top" surface of circuit structure 700 (e.g., through the intermediate layer where the signal traces 720 and Wilkinson dividers 724 exist). The access conductors 730 may each be a conductor, such as a segment of wire, through a hole that extends from the "top" surface down to the intermediate layer to achieve electrical contact with the signal traces 720. As described above, the Faraday walls 760 are formed by machining portions of the circuit structure 700 to form a trench, and filling the trench with a conductive material, such as a conductive ink, which may be applied using additive manufacturing techniques.

Figure 7:
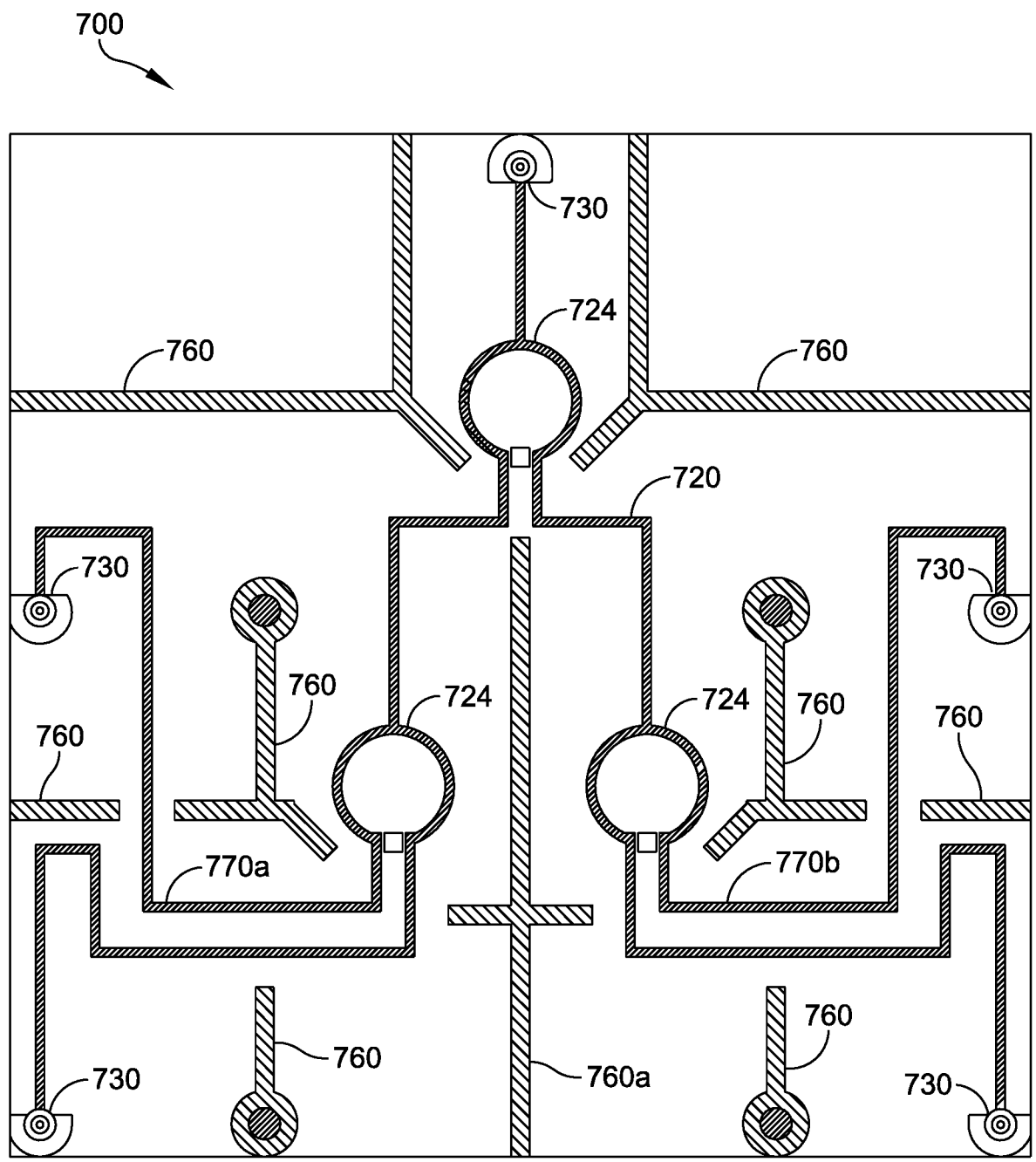
FIG. 7 is a schematic diagram of another example of an electromagnetic circuit that includes a Faraday wall.

Still referring to FIG. 7, as shown, the Faraday wall 760*a* is configured to at least partially isolate a first circuit portion 770*a* disposed within a layer of the circuit structure 700 from a second circuit portion 770*b* disposed within the layer of the circuit structure. In one embodiment, the first circuit portion 770*a* and the second circuit portion 770*b* is configured to operate in at least one of a microwave range of frequencies or a millimeter wave range of frequencies. In a certain embodiment, the first circuit portion 770*a* is configured to operate in a first range of frequencies and the second circuit portion 770*b* is configured to operate in a second range of frequencies that overlaps with the first range of frequencies. In another certain embodiment, the first circuit portion 770*a* is configured to operate in a first range of frequencies and the second circuit portion 770*b* is configured to operate in a second range of frequencies, at least one frequency in the second range of frequencies being within an octave of at least one frequency in the first range of frequencies.

In one embodiment, forming the Faraday wall 760 (e.g., forming the electrically continuous conductor) does not include any steps of partial or full immersion in a fluid, electroplating, masking, etching, or dissolving.

Figure 8:
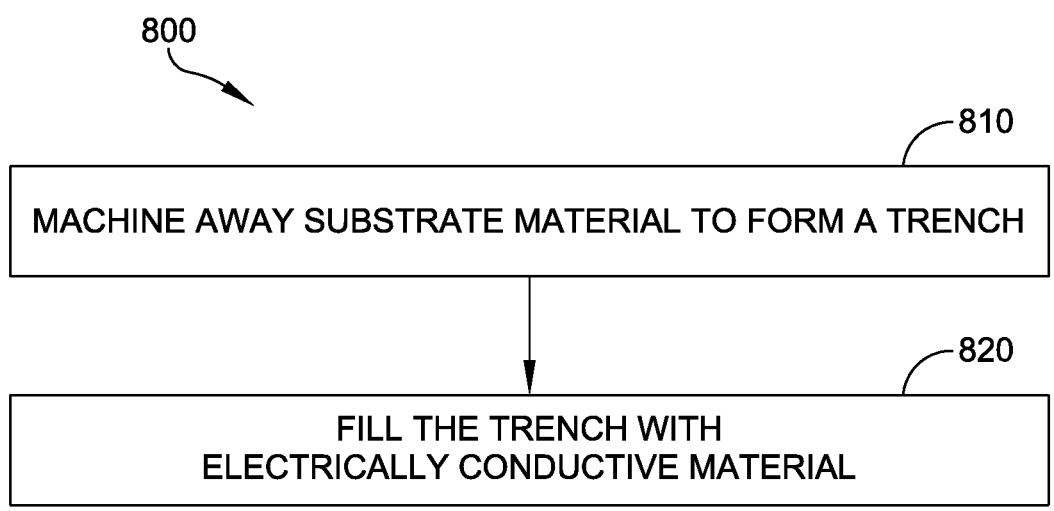
FIG. 8 is a flow diagram of a method of fabricating a Faraday wall.

FIG. 8 illustrates a method 800 of fabricating a Faraday wall. The method 800 includes machining away portions of one or more substrates of a circuit structure to form a trench (block 810) and filling the trench with a conductive material (block 820), such as a conductive ink. Forming the trench is a materially subtractive step, and filling the trench is a materially additive step. Conductive ink may be applied into the trench using 3-D printing techniques, in various embodiments.

Further advantages of system and methods described herein may be realized. For example, conventional PCB manufacturing may impose limitations on circuit feature sizes, such as the width of signal traces, thus limiting the highest frequencies for which conventionally made electromagnetic circuits may be suitable. Further, substrate thicknesses impact characteristic impedance (e.g., due to the distance to ground planes disposed upon opposing surfaces) in relation to width of the traces. Accordingly, wider traces required by conventional PCB processes cause selection of thicker substrates (to maintain a particular characteristic impedance), thus limiting how thin the circuit can be manufactured. For example, general recommendations under conventional PCB manufacturing include total thicknesses of about 60 mil (0.060 inches). By comparison, electromagnetic circuits in accordance with aspects and embodiments described, using additive manufacturing techniques, can result in circuit boards having a low profile down to a thickness of about 10 mil or less, with signal line traces having widths of about 4.4 mil, or 2.7 mil, or less, and interconnect geometries substantially flush with a surface of the board.

Ground vias conventionally provide electrical connectivity between ground planes (e.g., on opposing surfaces of substrates) and provide some isolation of signals on the traces from other traces that may be nearby. The conventional ground vias are drilled holes of about 8 mil diameter or greater, and are required to be a minimum distance apart to maintain structural integrity of the board. Accordingly, ground vias are leaky structures, exhibiting loss of electromagnetic signal, especially at higher frequencies. As various applications require support for higher frequency signals, the minimum spacing between ground vias act like large openings through which relatively small wavelengths of electromagnetic energy may escape.

By comparison, electromagnetic circuits and methods in accordance with aspects and embodiments described herein, which use additive manufacturing techniques, allow for electrically continuous Faraday boundaries, which may further be electrically coupled to ground planes. Accordingly, an electrically continuous structure is provided and disposed vertically through one or more substrates, (e.g., between opposing surfaces of the substrate) to form "Faraday walls" that confine electromagnetic fields. In various embodiments, such Faraday walls may electrically couple two or more ground planes. Further in various embodiments, such Faraday walls may confine and isolate electromagnetic fields from neighboring circuit components. In some embodiments, such Faraday walls may enforce a boundary condition to limit electromagnetic signals to be locally transverse electric-magnetic (TEM) fields, e.g., limiting signal propagation to a TEM mode.

In various embodiments, various subtractive (machining, milling, drilling), additive (printing, filling), and adherent (bonding) steps may be carried out, in various orders, with soldering and reflow operations as necessary, to form an electromagnetic circuit having one or any number of substrate layers, which may include one or more Faraday boundaries as described herein.

A generalized method for making any of various electromagnetic circuits includes milling a conductive material disposed on a substrate to form circuit features. The method may include printing (or depositing, e.g., via 3-D printing, additive manufacturing techniques) additional circuit features, such as resistors formed of resistive ink, for example. The method may include depositing solder on any feature, as necessary. The method may also include milling (or drilling) through substrate material (and/or conductive materials) to form openings, such as voids or trenches, and includes depositing or printing (e.g., via 3-D printing, additive manufacturing techniques) conductive material (such as conductive ink or a wire conductor) into the voids/trenches, for example to form Faraday walls or vertical signal launches (e.g., copper). Any of these steps may be done in different orders, repeated, or omitted as necessary for a given circuit design. In some embodiments, multiple substrates may be involved in the manufacture of an electromagnetic circuit, and the method includes bonding further substrates as necessary, further milling and filling operations, and further soldering and/or reflow operations.

Having described several aspects of at least one embodiment and a method for manufacturing an electromagnetic circuit, the above descriptions may be employed to produce various electromagnetic circuits with an overall thickness of 10 mils (0.010 inches, 254 microns) or less, and may include signal traces, such as the traces as narrow as 4.4 mils (111.8 microns), 2.7 mils (68.6 microns), or even as narrow as 1.97 mils (50 microns), depending upon the tolerances and accuracy of various milling and additive manufacturing equipment used. Accordingly, electromagnetic circuits in accordance with those described herein may be suitable for microwave and millimeter wave applications, including S-Band, X-Band, K-Bands, and higher frequencies, with various embodiments capable of accommodating frequencies over 28 GHz and up to 70 GHz or higher. Some embodiments may be suitable for frequency ranges up to 300 GHz or more.

Additionally, electromagnetic circuits in accordance with those described herein may have a low enough profile (e.g., thickness of 10 mils or less), with accordant light weight, to be suitable for outer space applications, including folding structures to be deployed by unfolding when positioned in outer space.

Further, electromagnetic circuits manufactured in accordance with methods described herein accommodate less expensive and faster prototyping, without the necessity for caustic chemicals, masking, etching, electroplating, etc. Simple substrates with pre-plated conductive material disposed on one or both surfaces (sides) may form the core starting material, and all elements of an electromagnetic circuit may be formed by milling (subtractive, drilling), filling (additive, printing of conductive and/or resistive inks), and bonding one or more substrates. Simple solder reflow operations and insertion of simple conductors (e.g., copper wire) are accommodated by methods and systems described herein.

Further, electromagnetic circuits manufactured in accordance with methods described herein may accommodate deployment on, or designs calling for, non-planar surfaces. Thin, low-profile electromagnetic circuits, such as described herein and others, may be manufactured using mill, fill, and bond techniques as described herein to produce electromagnetic circuits having any desired contour, to adhere to a surface (such as a vehicle) or to support a complex array structure, for instance.

An appendix that includes various additional details and aspects is filed concurrently herewith and is hereby incorporated in and part of this specification.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only.

What is claimed is:

1. A method of fabricating an electromagnetic circuit, the method comprising:
   providing a first dielectric substrate;
   providing a second dielectric substrate;
   machining a trench in the first and second dielectric substrates; and
   filling the trench with an electrically conductive material to form an electrically continuous conductor.

2. The method of claim 1, further comprising forming a first ground plane on a bottom surface of the second substrate and forming a second ground plane on a top surface of the first substrate, and providing a signal trace including a terminal pad.

3. The method of claim 2, further comprising securing a vertical conductor to the terminal pad of the signal trace.

4. The method of claim 3, wherein the electrically continuous conductor at least partially surrounds the vertical conductor.

5. A radio frequency circuit, comprising:
   at least one dielectric substrate;
   a trench formed in the at least one dielectric substrate; and
   an electrically continuous conductive material in the trench,
   wherein the electrically continuous conductive material is configured to at least partially isolate a first circuit portion disposed within a layer of the at least one dielectric substrate from a second circuit portion disposed within the layer of the at least one dielectric substrate, and
   wherein the first circuit portion is configured to operate in a first range of frequencies and the second circuit portion is configured to operate in a second range of frequencies, at least one frequency in the second range of frequencies being within an octave of at least one frequency in the first range of frequencies.

6. A radio frequency circuit, comprising:
   at least one dielectric substrate;
   a trench formed in the at least one dielectric substrate; and
   an electrically continuous conductive material in the trench,
   wherein the electrically continuous conductive material is configured to at least partially isolate a first circuit portion disposed within a layer of the at least one dielectric substrate from a second circuit portion disposed within the layer of the at least one dielectric substrate, and
   wherein the first circuit portion is configured to operate in a first range of frequencies and the second circuit portion is configured to operate in a second range of frequencies that overlaps with the first range of frequencies.

7. The radio frequency circuit of claim 6, wherein the at least one dielectric substrate includes a first dielectric substrate and a second dielectric substrate, the trench being formed in the first and second dielectric substrates.

8. The radio frequency circuit of claim 7, further comprising a first ground plane disposed upon a bottom surface of the second substrate and a second ground plane disposed upon a top surface of the first substrate, and a signal trace including a terminal pad.

9. The radio frequency circuit of claim 8, further comprising a vertical conductor secured to the terminal pad of the signal trace.

10. The radio frequency circuit of claim 9, wherein the electrically continuous conductive material at least partially surrounds the vertical conductor.

11. The radio frequency circuit of claim 6, wherein at least one of the first circuit portion and the second circuit portion is configured to operate in at least one of a microwave range of frequencies or a millimeter wave range of frequencies.

12. The radio frequency circuit of claim 6, wherein the electrically continuous conductive material is configured to at least partially contain an electromagnetic field within a confined region of the radio frequency circuit.

13. A method of fabricating an electromagnetic circuit, the method comprising:
   milling a conductive material disposed upon a first substrate to form a signal trace, the signal trace including a terminal pad;

bonding a second substrate to the first substrate to substantially encapsulate the signal trace and terminal pad between the first substrate and the second substrate;

drilling through the second substrate to provide an access hole to the terminal pad;

milling through the first and second substrates to form a trench, the trench positioned at least partially around the terminal pad;

depositing a conductor into the access hole, the conductor making electrical connection to the terminal pad; and depositing a conductive ink into the trench to form an electrically continuous conductor within the first and second substrates.

14. The method of claim 13, wherein the electrically continuous conductor is configured to at least partially isolate a first circuit portion disposed within the first substrate and the second substrate from a second circuit portion disposed within the first substrate and the second substrate.

15. The method of claim 14, wherein at least one of the first circuit portion and the second circuit portion is configured to operate in at least one of a microwave range of frequencies or a millimeter wave range of frequencies.

16. The method of claim 14, wherein the first circuit portion is configured to operate in a first range of frequencies and the second circuit portion is configured to operate in a second range of frequencies that overlaps with the first range of frequencies.

17. The method of claim 14, wherein the first circuit portion is configured to operate in a first range of frequencies and the second circuit portion is configured to operate in a second range of frequencies, at least one frequency in the second range of frequencies being within an octave of at least one frequency in the first range of frequencies.

* * * * *